United States Patent
Tatehata et al.

(10) Patent No.: US 8,212,787 B2
(45) Date of Patent: Jul. 3, 2012

(54) MOVABLE CONTACT BODY AND SWITCH USING SAME

(75) Inventors: Naoki Tatehata, Kyoto (JP); Yousuke Chikahisa, Hyogo (JP); Koji Tanabe, Osaka (JP)

(73) Assignee: Panasonic Corporation, Osaka (JP)

( * ) Notice: Subject to any disclaimer, the term of this patent is extended or adjusted under 35 U.S.C. 154(b) by 637 days.

(21) Appl. No.: 12/352,769

(22) Filed: Jan. 13, 2009

(65) Prior Publication Data

US 2009/0179872 A1    Jul. 16, 2009

(30) Foreign Application Priority Data

Jan. 15, 2008 (JP) ................. 2008-005348

(51) Int. Cl.
*G06F 3/041* (2006.01)

(52) U.S. Cl. .............. 345/173; 345/174; 200/314

(58) Field of Classification Search ............ None
See application file for complete search history.

(56) References Cited

U.S. PATENT DOCUMENTS

| 7,528,903 | B2 * | 5/2009 | Uchida | 349/86 |
| 7,635,819 | B2 * | 12/2009 | Lee et al. | 200/313 |
| 7,683,279 | B2 * | 3/2010 | Kim | 200/310 |
| 2007/0132737 | A1 * | 6/2007 | Mulligan et al. | 345/173 |
| 2008/0198625 | A1 * | 8/2008 | Inoue | 362/617 |

FOREIGN PATENT DOCUMENTS

JP 2007-141269 6/2007
WO WO 2007100180 A1 * 9/2007

* cited by examiner

*Primary Examiner* — Lixi C Simpson
(74) *Attorney, Agent, or Firm* — Wenderoth, Lind & Ponack, L.L.P.

(57) ABSTRACT

A touch panel has a plurality of band-like optically transmissive lower electrodes and upper electrodes formed at predetermined intervals in directions perpendicular to each other on an upper surface of an optically transparent base sheet. A dome-like movable contact is formed from a conductive metal sheet which is mounted under the touch panel. A light guide sheet with a plurality of convex-concave light emitting portions is formed on an optically transparent substrate, which is disposed between the touch panel and the movable contact. Accordingly, uniform illumination can be attained by using only one or two light emitting elements, and it is possible to obtain a movable contact body capable of inexpensive and reliable illumination.

4 Claims, 4 Drawing Sheets

FIG. 7 – PRIOR ART
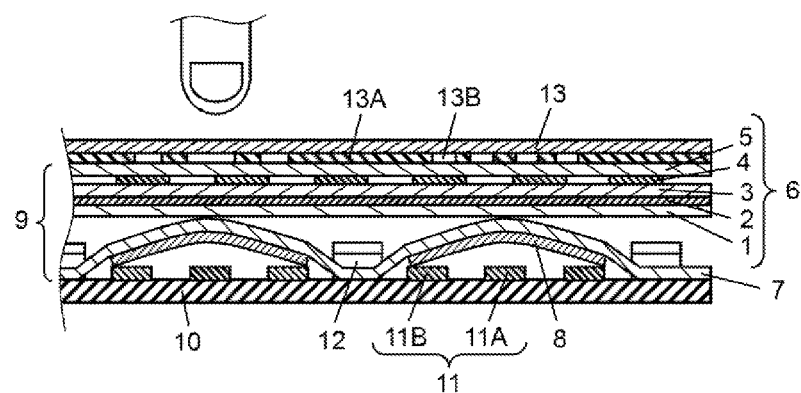

MOVABLE CONTACT BODY AND SWITCH USING SAME

BACKGROUND OF THE INVENTION

1. Field of the Invention

The present invention relates to a movable contact body mainly used for operation of various electronic apparatuses, and a switch using the same.

2. Background Art

Recently, in various electronic apparatuses, portable terminal equipment such as cell phones in particular, apparatuses with operational sections illuminated by light emitted from light emitting diodes or EL (electro-luminescence) elements so that push-buttons and display sheets or the like can be easily distinguished and manipulated even in the dark are increasing, and movable contact bodies or switches used in these apparatuses are also required to be able to inexpensively perform such lighting for illumination.

A conventional movable contact body and switch disclosed in Unexamined Japanese Patent Publication 2007-141269 is described with reference to FIG. 7. The drawing is dimensionally enlarged in the direction of thickness for making it easier to see the configuration. FIG. 7 is a sectional view of a conventional switch.

In FIG. 7, lower base sheet 1 is a film having optical transparency. Lower electrode 2 is a band formed from indium tin oxide or the like, and it is optically transmissive. A plurality of lower electrodes 2 are arranged at predetermined intervals on the upper surface of lower base sheet 1.

Also, upper base sheet 3 is a film having optical transparency. Upper electrode 4 is a band formed from indium tin oxide, and it is optically transmissive. A plurality of upper electrodes 4 are arranged at predetermined intervals on the upper surface of upper base sheet 3 in a direction perpendicular to lower electrodes 2.

Further, protective sheet 5 is a film having optical transparency. Upper base sheet 3 with upper electrodes 4 arranged thereon is laminated on the upper surface of lower base sheet 1 with lower electrodes 2 arranged thereon. Also, protective sheet 5 is laminated on the upper surface of upper base sheet 3 with upper electrodes 4 arranged thereon. Further, these are bonded to each other by adhesive (not shown) or the like to configure touch panel 6.

A specified portion of the periphery of cover sheet 7 is attached to the underside of touch panel 6 by using adhesive (not shown). Further, a plurality of movable contacts 8 are attached to the underside of cover sheet 7, thereby configuring movable contact body 9. Cover sheet 7 is a film. Each movable contact 8 is nearly a dome which is formed from a conductive metal sheet.

Also, on the upper surface of wiring board 10 formed with a plurality of wiring patterns (not shown) on the upper and lower surfaces thereof are disposed a plurality of fixed contacts 11 formed of nearly circular central fixed contacts 11A and nearly horseshoe-shaped or nearly ring-shaped outer fixed contacts 11B disposed there around.

Further, movable contact body 9 is attached to the upper surface of wiring board 10 in such manner that the outer periphery of each movable contact 8 is placed on outer fixed contact 11B. Also, movable contact body 9 is attached to the upper surface of wiring board 10 in such manner that the underside center of movable contact 8 is opposed to central fixed contact 11A at predetermined intervals.

A plurality of light emitting elements 12 such as light emitting diodes are mounted on the upper surface of wiring board 10, and these are arranged between a plurality of movable contacts 8 with their light emitting surfaces faced upward.

Also, shielding portion 13A is formed by printing or the like on the underside of display sheet 13 which is a film having optical transparency. Specified parts of shielding portion 13A are punched out into shapes of letters and marks or the like to form a plurality of display portions 13B. Display portions 13B are arranged above movable contact 8, thereby configuring a switch.

A switch having such a configuration is mounted on the operation surface of an electronic apparatus. Lower electrodes 2 and upper electrodes 4 of touch panel 6, central fixed contacts 11A and outer fixed contacts 11B, and light emitting elements 12 are connected to an electronic circuit (not shown) of the electronic apparatus via a wiring pattern or lead wire (not shown).

In the above configuration, with a voltage applied from the electronic circuit to a plurality of lower electrodes 2 and upper electrodes 4 in order, when the upper surface of display sheet 13 is lightly touched with the finger for executing touch operation, then a part of the charge of touch panel 6 travels to the finger. Accordingly, the capacitance change takes place between lower electrode 2 and upper electrode 4 under the manipulated portion. As a result, which portion of display sheet 13 was subjected to touch operation is detected by the electronic circuit.

Also, when specified display portion 13B of display sheet 13 is pressed downward, display sheet 13 and touch panel 6 flex and it causes the central portion of the nearly dome-like shape of movable contact 8 to be pressed. In this way, when a specified pressing force is applied, movable contact 8 is resiliently reversed downward while providing a click feeling. In this case, the underside center surface of movable contact 8 comes in contact with central fixed contact 11A, then central fixed contact 11A and outer fixed contact 11B are electrically connected to each other via movable contact 8. As a result, display portion 13B then pressed is detected by the electronic circuit.

When the pressing force to display sheet 13 is released, movable contact 8 is resiliently reversed upward due to the resiliently restoring force, and the underside center of movable contact 8 moves apart from central fixed contact 11A. In this way, central fixed contact 11A and outer fixed contact 11B are electrically disconnected from each other.

Various functions of an apparatus are switched in accordance with the touch operation and pressing operation. When power is supplied from an electronic circuit of an electronic apparatus to light emitting elements 12, light is emitted from the plurality of light emitting elements 12. The light passes across touch panel 6 and illuminates a plurality of display portions 13B of display sheet 13 from below, and thereby, the display of letters, marks or the like of display portion 13B can be easily distinguished, and it is possible to easily perform the operation.

That is, the portion subjected to touch operation of display sheet 13 is detected by the electronic circuit in accordance with the capacitance change of touch panel 6. Further, each portion pressed is detected by the electronic circuit in accordance with electrical connection and disconnection of fixed contact 11. Also, light is emitted from a plurality of light emitting diodes 12 by the function of the electronic circuit. The conventional switch is configured in that a plurality of display portions 13B of display sheet 13 are illuminated through these operations.

However, in movable contact body 9 mentioned above and a switch using the contact, a plurality of light emitting elements 12 are disposed between a plurality of movable contacts 8, and light is emitted from light emitting elements 12 for illuminating a plurality of display portions 13B of display sheet 13. Accordingly, it is necessary to use many light emitting elements 12, requiring much time for the manufacture, and there arises a problem of costs.

SUMMARY OF THE INVENTION

The present invention is intended to solve such a conventional problem, and the object is to provide a movable contact body which is inexpensive and capable of excellent illumination, and a switch using the contact body.

The present invention comprises a touch panel including a plurality of band-like lower electrodes and upper electrodes which are optically transmissive and are formed at intervals in directions perpendicular to each other on the upper surface of an optically transparent base sheet, a dome-like movable contact formed from a conductive metal sheet disposed under the touch panel, and a light guide sheet with a plurality of convex-concave light emitting portions formed on an optically transparent substrate, which is disposed between the touch panel and the movable contact.

In the above configuration, the light from light emitting elements is guided to a plurality of display portions by means of the light guide sheet, and therefore, it is possible to realize uniform illumination by using only one or two light emitting diodes, and a movable contact body capable of excellent illumination can be obtained at low costs.

BRIEF DESCRIPTION OF THE DRAWINGS

FIG. 7 is a sectional view of a conventional switch.

DETAILED DESCRIPTION OF THE INVENTION

Figure 1:
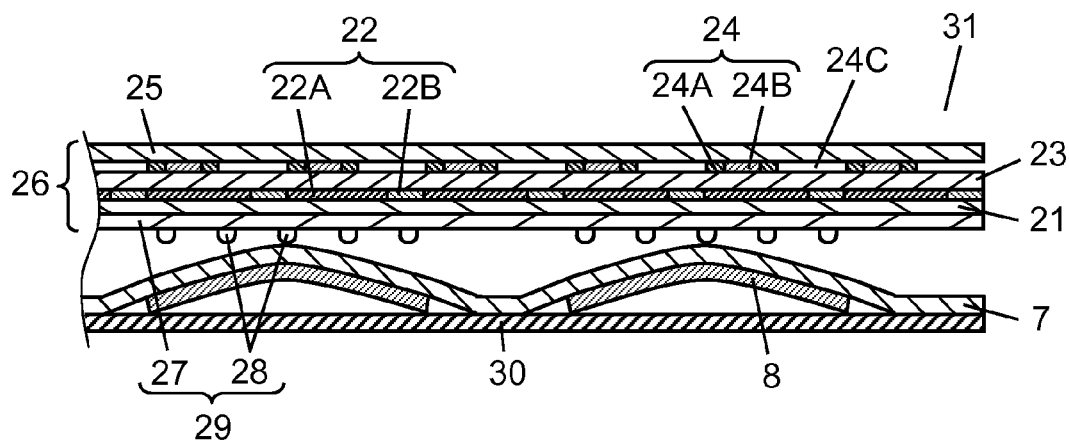
FIG. 1 is a sectional view of a movable contact body in one exemplary embodiment of the present invention.

An exemplary embodiment of the present invention will be described in the following with reference to FIG. 1 to FIG. 6B. In these drawings, the sizes in the direction of thickness in sectional views are enlarged to make it easier to observe the configuration. Also, component parts the same as those described in the section of background art are given the same reference numerals, and their detailed description is simplified.

Figure 2:
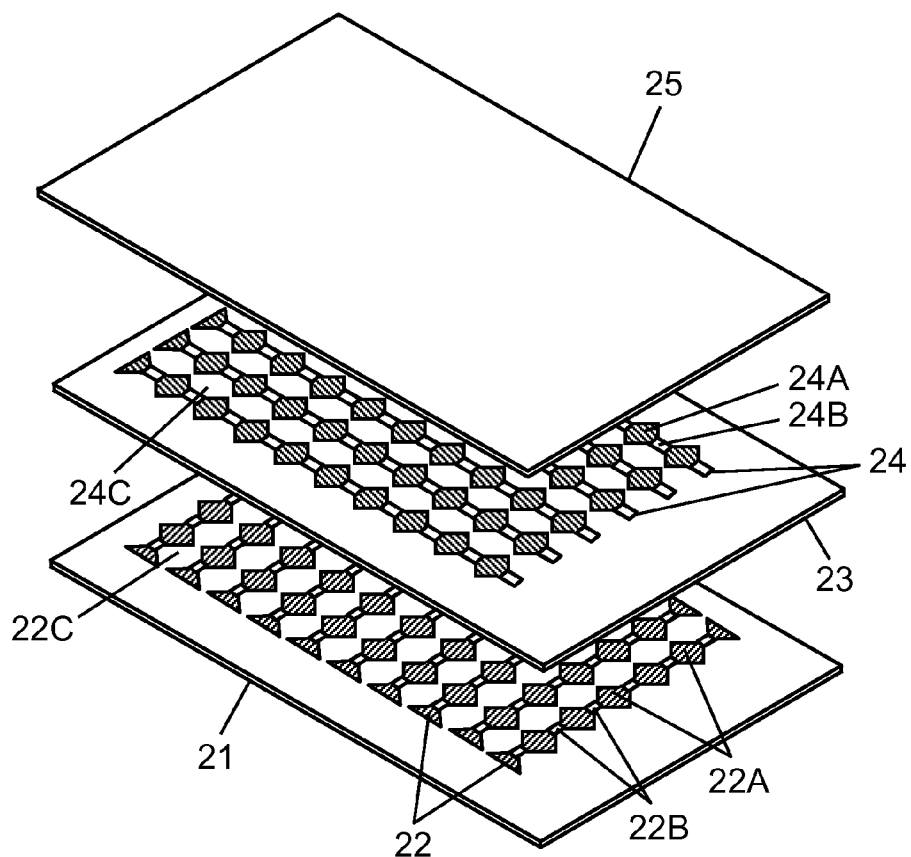
FIG. 2 is an exploded perspective view of a touch panel of the movable contact body.

FIG. 1 is a sectional view of a movable contact body in one exemplary embodiment of the present invention. FIG. 2 is an exploded perspective view of a touch panel in the exemplary embodiment. In the figure, a plurality of band-like optically transmissive lower electrodes 22 are arranged at intervals on the upper surface of film-like optically transparent lower base sheet 21. Lower base sheet 21 is formed from polyether sulfone, polycarbonate, polyethylene terephthalate or the like.

Also, a plurality of upper electrodes 24 which are nearly band-like and optically transmissive are arranged at intervals in a direction perpendicular to lower electrode 22 on the upper surface of upper base sheet 23 which is film-like and optically transparent the same as lower base sheet 21.

The plurality of lower electrodes 22 and upper electrodes 24 include a plurality of nearly square transmissive portions 22A and 24A formed from conductive resin such as polythiophene and polyaniline. Also, the plurality of lower electrodes 22 and upper electrodes 24 include a plurality of nearly rectangular conductive portions 22B and 24B formed from polyester or epoxy with silver or carbon dispersed for the connection of a plurality of transmissive portions 22A and 24A.

A plurality of nearly square void portions 22C and 24C are disposed between the plurality of lower electrodes 22 and between the plurality of upper electrodes 24 respectively. Lower base sheet 21 and upper base sheet 23 are bonded to each other by using adhesive (not shown) such as acryl and rubber so that the plurality of transmissive portions 22A and void portions 24C, and the plurality of void portions 22C and transmissive portions 24A are alternately placed one upon another to be vertically positioned and opposed to each other at intervals.

That is, except the portions where gray or black conductive portions 22B, 24B are placed one upon another, optically transmissive portion 22A and void portion 24C, and void portion 22C and transmissive portion 24A are respectively placed one upon another, and thereby, it is configured in that the light is transmitted nearly over the entire surface.

Also, to make such a plurality of lower electrodes 22 and upper electrodes 24, firstly, a plurality of transmissive portions 22A, 24A are printed and dried respectively on the upper surfaces of lower base sheet 21 and upper base sheet 23 by means of screen printing. After that, similarly a plurality of conductive portions 22B, 24B are printed and dried respectively on the upper surfaces of lower base sheet 21 and upper base sheet 23. In this way, the electrodes can be easily manufactured in relatively short time.

Upper base sheet 23 is laminated on the upper surface of lower base sheet 21. Film-like optically transparent protective sheet 25 is laminated on the upper surface of upper base sheet 23. These are bonded to each other by using adhesive (not shown) or the like, thereby configuring touch panel 26.

Also, a plurality of convex-concave light emitting portions 28 are formed in dot-like shapes by printing or affixing on predetermined portions of the underside of film-like substrate 27 having flexibility and optical transparency, thereby configuring light guide sheet 29. Light guide sheet 29 is attached to the underside of touch panel 26. Substrate 27 is formed from polyethylene terephthalate, polycarbonate, polyurethane, silicone or the like. Light emitting portions 28 are formed from acryl, polyester, epoxy, silicone or the like.

A predetermined peripheral portion of film-like cover sheet 7 having flexibility is bonded to the underside of light guide sheet 29 by means of adhesive (not shown). A plurality of nearly dome-like movable contacts 8 formed from a conductive metal sheet are attached to the underside of cover sheet 7 under light emitting portions 28. Cover sheet 7 is formed from polyethylene terephthalate, polycarbonate or the like. Movable contact 8 is formed from copper alloy, steel or the like.

Film-like separator 30 is attached to the underside of cover sheet 7 so as to cover the entire surface thereof, and movable contact body 31 is configured, taking care so that dust or the like will not stick to the underside of movable contact 8 during storage or transportation. Separator 30 is formed from polyethylene terephthalate or the like.

Figure 3:
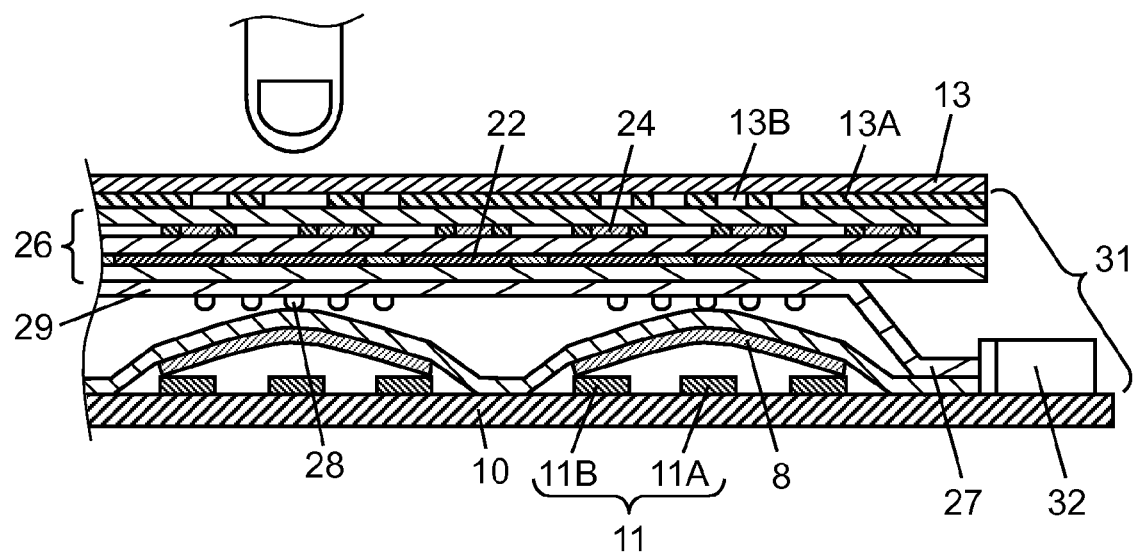
FIG. 3 is a sectional view of a switch using the movable contact body.
Figure 4:
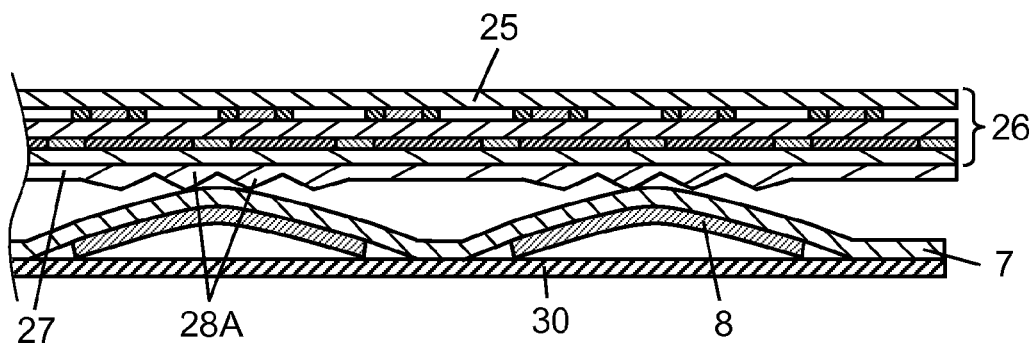
FIG. 4 is a sectional view of a movable contact body in another exemplary embodiment of the present invention.
Figure 5:
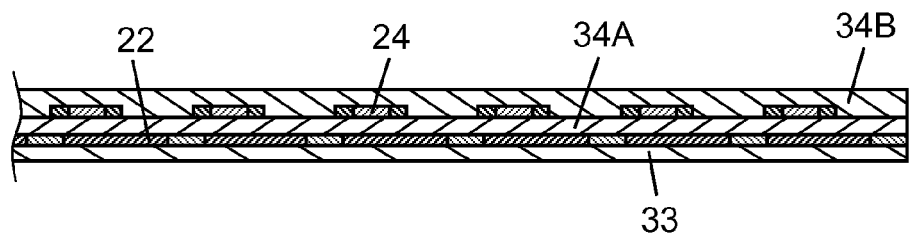
FIG. 5 is a sectional view of a touch panel of the movable contact body.

FIG. 3 is a sectional view of a switch using movable contact body 31 in this exemplary embodiment having a configuration above described. In the figure, a plurality of wiring patterns (not shown) are formed by using copper or the like on the upper and lower surfaces of film-like or plate-like wiring board 10. Further, nearly circular central fixed contacts 11A are formed by using copper or carbon on the upper surface of wiring board 10. Also, on the upper surface of wiring board 10, nearly horseshoe-like or nearly ring-like outer fixed contacts 11B are formed around central fixed contacts 11A by using copper or carbon. That is, a plurality of fixed contacts 11 each formed of central fixed contact 11A and outer fixed contact 11B are disposed on the upper surface of wiring board 10. Film-like wiring board 10 is formed from polyethylene terephthalate, polycarbonate or the like. Plate-like wiring board 10 is formed from paper phenol, glass-contained epoxy or the like.

Movable contact body 31 with separator 30 removed therefrom is attached to the upper surface of wiring board 10 in such manner that the outer periphery of each movable contact 8 is placed on outer fixed contact 11B and the underside center of movable contact 8 is opposed to central fixed contact 11A at intervals as specified. In this way, a plurality of switch contacts are formed on the underside of touch panel 26.

Light emitting element 32 such as light emitting diode is mounted on the upper surface of wiring board 10 at the right of light guide sheet 29. Also, light emitting element 32 is arranged with its light emitting surface faced to the right-hand side of light guide sheet 29.

Shielding portion 13A is formed by printing or the like on the underside of film-like optically transmissive display sheet 13. A plurality of display portions 13B are formed by punching out a predetermined part of shielding portion 13A into shapes such as letters and marks. Display portions 13B are arranged above light emitting portions 28 of light guide sheet 29, thereby configuring the switch.

A switch thus configured is mounted on the operational surface of an electronic apparatus. Lower electrodes 22 and upper electrodes 24 of touch panel 26, and a plurality of fixed contacts 11 and light emitting elements 32 are connected to electronic circuits (not shown) of the electronic apparatus via the wiring patterns and lead wires (not shown).

In the above configuration, in such a condition that a voltage is sequentially applied from the electronic circuit to the plurality of lower electrodes 22 and upper electrodes 24, the upper surface of display sheet 13 is lightly touched with the finger to make the touch operation. In this way, a part of the charge of touch panel 26 is conducted to the finger, such that lower electrodes 22 and upper electrodes 24 are subjected to the operation change in capacitance. As a result, which portion of display sheet 13 was subjected to touch operation is detected by the electronic circuit.

In this case, the plurality of lower electrodes 22 and upper electrodes 24 are laminated in such manner that void portions 24C and transmissive portions 24A are respectively placed upon transmissive portions 22A and void portions 22C in an alternate fashion to be vertically positioned. Accordingly, the capacitance change caused by finger touch is not detected between lower electrodes 22 and upper electrodes 24, but each capacitance change of lower electrodes 22 and upper electrodes 24 near the manipulated portion is detected. Therefore, the manipulated portion can be easily detected by the electronic circuit.

That is, in case of detecting capacitance change between a plurality of lower electrodes 22 and upper electrodes 24, for example, when lower electrodes 22 and upper electrodes 24 are 5 pieces each (i.e., when there are 5 lower electrodes 22 and 5 upper electrodes 24), it is necessary to perform the detection for the number of combinations with all upper electrodes 24 with respect to each lower electrode 22, that is, 25 times of performing the detection.

On the other hand, in the case of the present invention in which transmissive portions 22A, 24A are vertically alternately formed, and the capacitance change of lower electrode 22 and upper electrode 24 near the manipulated portion is detected, the detection is performed for the total number of the plurality of lower electrodes 22 and upper electrodes 24, that is, only 10 times of performing the detection. Accordingly, it is possible to easily perform the detection of manipulated portion.

Also, when display portion 13B of display sheet 13 is pressed downward, touch panel 26 and light guide sheet 29 flex to press the nearly dome-like central portion of movable contact 8, thereby applying the specified pressure thereto. As a result, movable contact 8 is resiliently reversed downward with a click feeling provided, and then the underside center of movable contact 8 comes in contact with central fixed contact 11A. Accordingly, central fixed contact 11A and outer fixed contact 11B become electrically connected to each other via movable contact 8. Consequently, display portion 13B then pressed is detected by the electronic circuit.

When the pressing force to display sheet 13 is released, movable contact 8 is resiliently reversed upward due to the resiliently restoring force, then the underside center of movable contact 8 moves off central fixed contact 11A. As a result, central fixed contact 11A and outer fixed contact 11B are electrically disconnected from each other.

Various functions of an electronic apparatus are switched in accordance with these touch operations and pressing operations. At the same time, when power is supplied from the electronic circuit of the electronic apparatus to light emitting element 32, light is emitted from light emitting element 32, and the light enters light guide sheet 29 from the right-hand side and propagates through substrate 27 reflecting inside to the left-hand side.

The light is scattered and reflected from a plurality of light emitting portions 28 on the underside of light guide sheet 29 and passes across touch panel 26 to illuminate a plurality of display portions 13B of display sheet 13 from below. In this way, the letter, mark or the like of display portion 13B can be distinguished, enabling easy operation of the switch.

That is, the electronic circuit functions in accordance with the capacitance change of touch panel 26 to detect the manipulated portion of display sheet 13, the portion pressed by the finger, through electrical connection and disconnection of fixed contact 11. At the same time, the light from light emitting element 32 is guided into light guide sheet 29 from the right-hand side so that the light is emitted from a plurality of light emitting portions 28, thereby illuminating a plurality of display portions 13B of display sheet 13.

In this case, the light from light emitting element 32 is guided into light guide sheet 29, and the light is emitted from a plurality of light emitting portions 28, and thereby, a plurality of display portions 13B are illuminated. Accordingly, it is possible to uniformly illuminate a plurality of display portions 13B by using only one or two light emitting elements 32.

Also, in this case, the light from a plurality of light emitting portions 28 passes across touch panel 26 to illuminate a plurality of display portions 13B. As described above, in almost all portions except the overlapped portions of conductive portions 22B, 24B of upper electrodes 22 and lower electrodes 24, optically transmissive portions 22A, 24A made of conductive resin and void portions 24C, 22C are formed in a way of overlapping each other. Accordingly, the brightness is hardly affected by touch panel 26, ensuring bright and excellent illumination.

Further, lower electrodes 22 and upper electrodes 24 of touch panel 26 are formed from conductive resin. Therefore, unlike the case of using indium tin oxide or the like for example, touch panel 26 can be formed by a simple method such as screen printing as described above without taking much time and labor for etching and cleaning.

Also, each of the lower electrodes 22 and upper electrodes 24 of touch panel 26 is formed of a plurality of transmissive portions 22A, 24A, and conductive portions 22B, 24B which connect the plurality of transmissive portions 22A, 24A. Therefore, the resistance of lower electrodes 22 and upper electrodes 24 is small in value, enabling touch panel 26 to perform stable and reliable touch operation.

That is, the whole of each lower electrode 22 and each upper electrode 24 is not formed by using conductive resin such as polythiophene or polyaniline whose area resistance is 500 ohm to 1.5 Kohm/square that is relatively large in value. A plurality of transmissive portions 22A, 224 made of conductive resin are connected by conductive portions 22B, 24B made of polyester or epoxy with silver or carbon dispersed therein whose area resistance is 10 ohm to 300 ohm/square that is small in value. Thus, it is possible to make the resistance of lower electrodes 22 and upper electrodes 24 smaller in value.

As described above, in the present exemplary embodiment, on the upper surface of optically transmissive lower base sheet 21 and upper base sheet 23, there is provided touch panel 26 with band-like optically transmissive lower electrodes 22 and upper electrodes 24 formed at intervals in directions perpendicular to each other. On the underside of the touch panel is mounted nearly dome-like movable contact 8 formed from conductive metal sheet with light guide sheet 29 therebetween with a plurality of convex-concave light emitting portions 28 formed on optically transmissive substrate 27, thereby configuring movable contact body 31. In this way, the light from light emitting element 32 is guided by light guide sheet 29 to a plurality of display portions 13B. Accordingly, uniform illumination can be attained by using only one or two light emitting elements, and it is possible to obtain a movable contact body capable of reliable illumination at low cost and a switch using the movable contact body.

In the above description, a plurality of convex-concave light emitting portions 28 are formed in a dotted fashion by a printing or affixing method on the underside of substrate 27 of light guide sheet 29. However, as shown in the sectional view of FIG. 4, the same effect as in the exemplary embodiment can be obtained even in case a plurality of convex-concave light emitting portions 28A having a pyramids-like or sawtooth-like shape are disposed on the underside of substrate 27 by a molding or press machining method.

In the above description, a plurality of convex-concave light emitting portions 28, 28A are formed on the underside of light guide sheet 29 above movable contact 8. However, it is also allowable to attain the illumination through scatter or reflection of the light by disposing light emitting portions 28, 28A on the upper surface of light guide sheet 29 instead of the underside thereof.

Also, in the above description, upper base sheet 23 with a plurality of band-like upper electrodes 24 formed on the upper surface is placed on the upper surface of lower base sheet 21 with a plurality of nearly band-like lower electrodes 22 formed on the upper surface, and thereby, lower electrodes 22 and upper electrodes 24 are formed at intervals in directions perpendicular to each other, thereby configuring touch panel 26. However, as shown in the sectional view of FIG. 5, it is also allowable to form these components on one base sheet by printing in a laminated fashion.

That is, as shown in the figure, a plurality of nearly band-like lower electrodes 22 are first formed and dried by screen printing on the upper surface of film-like optically transmissive base sheet 33. After that, optically transmissive lower insulating layer 34A made of epoxy or polyester resin is formed to cover the electrodes. On the surface thereof, a plurality of upper electrodes 24 in a direction perpendicular to lower electrode 22 and, to cover it, optically transmissive upper insulating layer 34B are sequentially placed one upon another and printed. In this way, a touch panel with lower electrodes 22 and upper electrodes 24 formed at intervals is configured, and thereby, it is possible to form the touch panel at low cost by using only one base sheet without need of protective sheet 25.

Further, in the above description, a plurality of band-like optically transmissive lower electrodes 22 and upper electrodes 24 of touch panel 26 are formed by a plurality of nearly square-shaped transmissive portions 22A, 24A and a plurality of nearly rectangular conductive portions 22B, 24B used to connect them. However, as shown in the partial plan view of FIG. 6A, a plurality of band-like lower electrodes 35 and upper electrodes are formed by using optically transmissive conductive resin so that a touched portion can be detected according to the change in capacitance between the electrodes. The same effect as in the exemplary embodiment mentioned above can be obtained by using such a configuration.

Figure 6A:
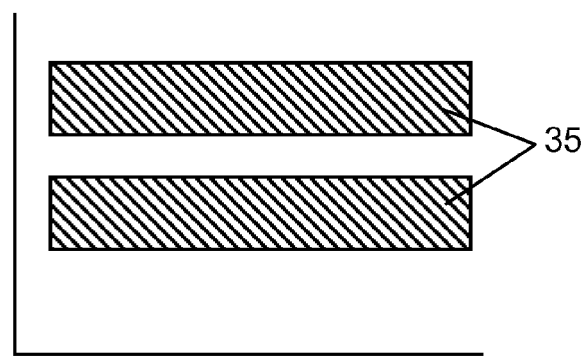
FIG. 6A is a plan view showing another essential portion of the movable contact body of the present invention.
Figure 6B:
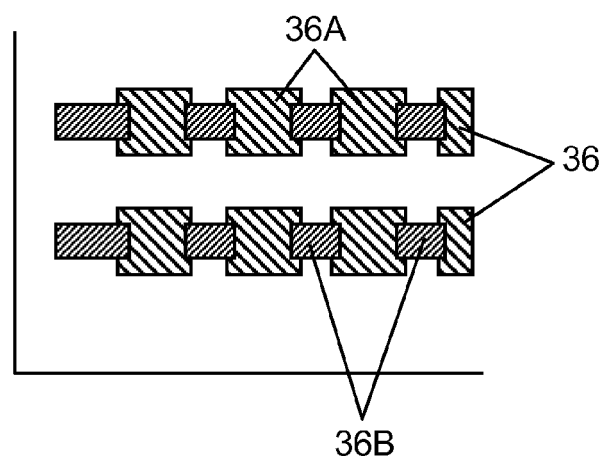
FIG. 6B is a plan view showing another essential portion of the movable contact body of the present invention.

Also, as shown in FIG. 6B, a plurality of nearly rectangular transmissive portions 36A are connected to each other in a band-like shape by using a plurality of conductive portions 36B in order to form lower electrode 36 and upper electrode. A touched portion is detected according to the change in capacitance between the electrodes. The same effect as in the exemplary embodiment mentioned above can be obtained by using such a configuration.

It takes rather much time and labor for the manufacture of these lower electrodes 22, 35, 36 and upper electrodes 24, but it is allowable to use optically transmissive indium tin oxide or tin oxide.

Also, in the above description, touch panel 26 is formed by laminating light guide sheet 29 on cover sheet 7 with a plurality of movable contacts 8 attached to the underside thereof in order to configure movable contact body 31. However, it is allowable to use lower base sheet 21 of touch panel 26 as the light guide sheet and to dispose a plurality of light emitting portions 28 on the underside thereof. Or, it is also allowable to attach a plurality of movable contacts 8 directly to the underside of light guide sheet 29. In these configurations, it is possible to form the movable contact body at lower costs.

As described above, the present invention comprises a touch panel in which a plurality of band-like optically transmissive lower electrodes and upper electrodes are formed at intervals in directions perpendicular to each other on the upper surface of an optically transmissive base sheet, a dome-like movable contact formed from conductive metal sheet mounted under the touch panel, and a light guide sheet with a plurality of convex-concave light emitting portions formed on an optically transmissive substrate which is disposed between the touch panel and the movable contact.

Due to such a configuration, light from the light emitting element is guided by the light guide sheet to a plurality of display portions. Accordingly, uniform illumination can be attained by using only one or two light emitting elements, and it is possible to obtain a movable contact body capable of inexpensive and reliable illumination.

Also, in the present invention above described, the lower electrode and upper electrode of the touch panel are formed of a plurality of transmissive portions made of conductive resin and a plurality of conductive portions for linking the plurality of transmissive portions.

Also, according to the configuration, lower electrodes and upper electrodes can be formed by a simplified method such as printing or the like. Further, because the conductive portions are formed by using silver, carbon or the like, the resistance of lower electrodes and upper electrodes is small in value and it is possible to perform stable and reliable operation.

Also, in the present invention, the movable contact body is attached to the upper surface of a wiring board with fixed contacts opposing the movable contact formed on the upper surface thereof. Due to such a configuration, it is possible to realize a switch capable of excellent illumination at low cost.

What is claimed is:

1. A movable contact body comprising:
    an optically transmissive touch panel;
    a dome-like movable contact disposed beneath said touch panel to be actuated by pressing of said touch panel in a direction toward said dome-like movable contact, said dome-like movable contact being formed of a conductive metal sheet; and
    a light guide sheet interposed between said optically transmissive touch panel and said dome-like movable contact to selectively provide illumination through said optically transmissive touch panel;
    wherein said optically transmissive touch panel includes
        an optically transparent lower base sheet,
        band-like optically transmissive lower electrodes disposed on an upper surface of said optically transparent lower base sheet at intervals and extending in a first direction,
        an optically transparent upper base sheet provided over said band-like optically transmissive lower electrodes,
        band-like optically transmissive upper electrodes disposed on an upper surface of said optically transparent upper base sheet at intervals and extending in a second direction perpendicular to said first direction, and
        an optically transparent protective sheet provided over said band-like optically transmissive upper electrodes;
    wherein each of the band-like optically transmissive lower electrodes and the band-like optically transmissive upper electrodes of the touch panel is formed of a plurality of transmissive portions formed from conductive resin and a plurality of conductive portions respectively linking the plurality of transmissive portions;
    wherein for each of the optically transmissive lower electrodes and the optically transmissive upper electrodes, the transmissive portions are wider than the conductive portions;
    wherein the optically transmissive lower electrodes are arranged such that void portions, where no electrode is provided, are formed between adjacent pairs of the transmissive portions;
    wherein the optically transmissive upper electrodes are arranged such that void portions, where no electrode is provided, are formed between adjacent pairs of the transmissive portions; and
    wherein the transmissive portions of the optically transmissive upper electrodes are aligned above the void portions of the optically transmissive lower electrodes, and the transmissive portions of the optically transmissive lower electrodes are aligned below the void portions of the optically transmissive upper electrodes; and
    wherein said light guide sheet includes an optically transparent substrate, and a plurality of convex-concave light emitting portions.

2. A switch comprising:
    a wiring board;
    the movable contact body of claim 1 mounted on an upper surface of said wiring board; and
    fixed contacts provided on the upper surface of the wiring board so as to oppose said movable contact.

3. The switch of claim 2, further comprising
    an optically transparent display sheet having provided thereon optical shielding portions and optical display portions defined by the optical shielding portions.

4. The movable contact body of claim 1, wherein the plurality of conductive portions are made of polyester or epoxy with silver or carbon dispersed therein and have an area resistance smaller than an area resistance of the plurality of transmissive portions.

* * * * *